(12) United States Patent
Fujita

(10) Patent No.: US 7,888,652 B2
(45) Date of Patent: Feb. 15, 2011

(54) ION IMPLANTATION APPARATUS

(75) Inventor: Hideki Fujita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 448 days.

(21) Appl. No.: 11/945,831

(22) Filed: Nov. 27, 2007

(65) Prior Publication Data

US 2008/0121822 A1    May 29, 2008

(30) Foreign Application Priority Data

Nov. 27, 2006  (JP)  ............................. 2006-318435
Nov. 27, 2006  (JP)  ............................. 2006-318436

(51) Int. Cl.
 *H01J 1/50*     (2006.01)
 *H01J 37/08*    (2006.01)
 *G21K 5/10*     (2006.01)

(52) U.S. Cl. .......................... 250/396 ML; 250/492.21

(58) Field of Classification Search ............. 250/396 R, 250/396 ML, 492.2, 492.21, 492.3, 306, 250/310
See application file for complete search history.

(56) References Cited

U.S. PATENT DOCUMENTS

| | | | |
|---|---|---|---|
| 3,952,198 A * | 4/1976 | Harada et al. ......... | 250/396 ML |
| 4,367,411 A * | 1/1983 | Hanley et al. ......... | 250/396 ML |
| 5,021,669 A * | 6/1991 | Wegmann et al. ..... | 250/396 ML |
| 5,481,116 A * | 1/1996 | Glavish et al. ........ | 250/396 ML |
| 6,403,967 B1 * | 6/2002 | Chen et al. ............ | 250/396 ML |
| 6,498,348 B2 * | 12/2002 | Aitken ................. | 250/396 ML |
| 6,703,628 B2 * | 3/2004 | Ye et al. ................ | 250/492.21 |
| 6,759,665 B2 * | 7/2004 | Benveniste et al. .... | 250/396 ML |
| 6,794,661 B2 * | 9/2004 | Tsukihara et al. ..... | 250/396 ML |
| 6,835,930 B2 * | 12/2004 | Benveniste et al. .......... | 250/298 |
| 6,885,014 B2 * | 4/2005 | Benveniste ........... | 250/396 ML |
| 7,323,700 B1 * | 1/2008 | Ledoux et al. ........ | 250/396 ML |
| 7,498,572 B2 * | 3/2009 | Fujita ..................... | 250/396 R |
| 2002/0043621 A1 * | 4/2002 | Aitken ........................ | 250/281 |
| 2003/0122090 A1 * | 7/2003 | Tsukihara et al. ...... | 250/492.21 |
| 2008/0067398 A1 * | 3/2008 | Dohi ................... | 250/396 ML |
| 2008/0135775 A1 * | 6/2008 | Smatlak et al. ....... | 250/396 ML |

FOREIGN PATENT DOCUMENTS

JP    8-124515    5/1996

(Continued)

OTHER PUBLICATIONS

Japanese Office Action for Japanese Application No. 2006-318436, dated Nov. 19, 2008 (7 pages).

(Continued)

*Primary Examiner*—Robert Kim
*Assistant Examiner*—Brooke Purinton
(74) *Attorney, Agent, or Firm*—Osha Liang LLP

(57) ABSTRACT

An ion implantation apparatus is provided with first and second magnets arranged so as to face each other in a Y direction across a path for a ribbon-shaped ion beam. The first and second magnets cross a traveling direction of the ribbon-shaped ion beam. Each of the first and second magnets has a pair of magnetic poles on an inlet side and on an outlet side of the ion beam. The polarities thereof are opposite between the first magnet and the second magnet.

10 Claims, 18 Drawing Sheets

FOREIGN PATENT DOCUMENTS

| | | |
|---|---|---|
| JP | 8115701 | 5/1996 |
| JP | 2000-039478 | 2/2000 |
| JP | 2005-195417 | 7/2005 |

OTHER PUBLICATIONS

Patent Abstracts of Japan for Japanese Publication No. 08-124515, Publication date May 17, 1996 (1 page).

Patent Abstracts of Japan, Publication No. 08-115701, Publication Date: May 7, 1996, 2 pages.

Patent Abstract of Japan, Publication No. 2000-039478, Publication Date: Feb. 8, 2000, 2 pages.

Patent Abstracts of Japan, Publication No. 2005-195417, Publication Date: Jul. 21, 2005, 2 pages.

\* cited by examiner (Prior Art)

(Prior Art)

(Prior Art)

ION IMPLANTATION APPARATUS

The present invention claims priority from Japanese Patent Application No. 2006-318435 filed on Nov. 27, 2006, and No. 2006-318436 filed on Nov. 27, 2006, the entire content of which is incorporated herein by reference.

BACKGROUND OF INVENTION

1. Field of the Invention

This invention relates to an ion implantation apparatus configured to irradiate an ion beam in a ribbon-shape having a larger dimension in an X direction than a dimension in a Y direction substantially orthogonal to the X direction which has scanned in the X direction, or has not scanned in the X direction onto a target, for performing ion implantation. More particularly, the invention relates to an improvement of a means for narrowing the ion beam in the Y direction.

2. Description of the Related Art

FIG. 16 shows a related art of this type of an ion implantation apparatus. The same ion implantation apparatus is described in JP-A-08-115701 (FIG. 1). In the specification and the drawings of the present application, a description is given by taking the case where ions forming an ion beam 4 are positive ions.

In the ion implantation apparatus, an ion beam 4 having a small cross section (e.g., a circular or rectangular spot shape) which will be formed in a ribbon-shaped ion beam is generated from an ion source 2, and the ion beam 4 having the small cross section is mass-separated through a mass separator 6. The mass-separated ion beams are accelerated or decelerated through an acceleration/deceleration device 8, energy-separated through an energy separator 10, scanned in the X direction (e.g., in the horizontal direction) through a scanner 12, and converted into parallel beams through a collimator 14. Then, the ion beams are irradiated onto a target 24 (e.g., a semiconductor substrate) held in a holder 26 to perform ion implantation into the target 24. A path for the ion beam 4 between the ion source 2 and the target 24 is held in a vacuum atmosphere.

The target 24 is mechanically scanned (reciprocatedly driven) along the Y direction (e.g., along the vertical direction) together with the holder 26 within the irradiation region of the ion beam 4 from a collimator 14 by a target driving device 28.

In the specification and the drawings of the present application, a description is given that the traveling direction of the ion beam is referred to as a Z direction. In addition, two directions substantially orthogonal to each other in a plane substantially orthogonal to the Z direction are referred to as the X direction and the Y direction.

In cooperation with the scanner 12 for scanning the ion beam 4 by a magnetic field or an electric field (in this example, a magnetic field), the collimator 14 bends the ion beam 4 scanned in the X direction so as to make it substantially parallel with a reference axis 16 by a magnetic field or an electric field (in this example, a magnetic field), and thus converts the ion beam 4 into a parallel beam. As a result, the ion beam 4 in a ribbon-shape having a larger dimension in the X direction than the dimension in the Y direction (see, FIG. 17, too) is led out. Though it is called as the "ribbon-shape", it is not meant that the dimension in the Y direction is as thin as paper or cloth. For example, the ion beam 4 has a dimension in the X direction of about 35 cm to 50 cm, and a dimension in the Y direction of about 5 cm to 10 cm. The collimator 14 is referred to as a beam parallelizing magnet when a magnetic field is used as in this example.

The ion implantation apparatus is an example of the case where the ion beam 4 in the ribbon-shape which has scanned in the X direction is irradiated onto the target 24. However, the ion beam 4 in the ribbon-shape may be generated from the ion source 2, and the ion beam 4 in the ribbon-shape may be irradiated onto the target 24 without having been scanned in the X direction.

The transport path for the ion beam 4 is in a vacuum chamber not shown, and held in a vacuum atmosphere. However, gases such as residual gases or out gases are necessarily present though in small amounts. When the ion beam 4 collides against the gas molecules, neutral particles occur. Then, the neutral particles are incident to the target 24, so that a uniformity of an implantation amount distribution is degraded. As a result, an error in implantation amount is caused, or other detrimental effects are caused.

Therefore, the ion beam 4 which is in an energy state to be irradiated onto the target 24 is deflected by an action of a magnetic field or an electric field by means of an ion beam deflector provided near the target 24. Thus, the deflected ion beam 4 and the neutral particles 18 going straight without deflection are separated from each other. As a result, the neutral particles 18 are prevented from being incident to the target 24. The collimator 14 also serves as the ion beam deflector.

The ion beam 4 diverges due to a space charge effect during a travel. From viewpoints of enhancing a throughput of an apparatus, reducing an ion implantation depth in order to miniaturize a semiconductor device formed on the target 24, and the like, the ion beam 4 to be irradiated onto the target 24 is required to have a low energy and a large electric current. However, a divergence of the ion beam 4 due to the space charge effect increases with a reduction in energy and an increase in electric current of the ion beam 4.

The divergence of the ion beam 4 occurs in both the X and Y directions. However, originally, the dimension in the X direction of the ion beam 4 is significantly larger than in the Y direction as described above. Therefore, the detrimental effect by the divergence in the Y direction is larger.

When the ion beam 4 diverges in the Y direction, a part of the ion beam 4 in the Y direction is cut by the vacuum chamber surrounding a path for the ion beam 4 and a mask or the like for shaping the ion beam 4. As a result, a transport efficiency of the ion beam 4 to the target 24 is reduced.

For example, a mask 20 having an opening 22 for passing the ion beam 4 and shaping the ion beam 4 may be disposed between the collimator 14 and the target 24, as shown in FIGS. 16 and 17, or as also disclosed in JP-B2-3567749. The mask 20 may cut an unnecessary bottom portion in the Y direction of the ion beam 4, thereby to shorten the distance $L_2$ missing the target 24 from the ion beam 4.

When the ion beam 4 diverges in the Y direction by the space charge effect, a rate of cutting to the ion beam 4 is increases by the mask 20. Accordingly, an amount of the ion beam 4 capable of passing through the mask 20 is reduced, resulting in a reduction of the transport efficiency of the ion beam 4.

The problem is also present similarly in the case where a ribbon-shaped ion beam 4 is generated from the ion source 2, and the ribbon-shaped ion beam 4 is irradiated onto the target 24 without having been scanned in the X direction.

As a means for compensating for the divergence in the Y direction due to the space charge effect of the ion beam 4, the following means may be considered. An electrostatic lens is provided in a vicinity on a downstream side or an upstream side of the collimator 14 in the path for the ion beam 4.

As shown in FIG. 18, the electrostatic lens 30 includes an inlet electrode 32, an intermediate electrode 34, and an outlet electrode 36 spaced apart from one another in the traveling direction Z of the ion beam 4. The inlet electrode 32 and the outlet electrode 36 are held at a mutually equal electric potential (in FIG. 18, ground potential). The intermediate electrode 34 is applied with a positive or negative direct current voltage $V_1$ from a direct current power source 38. Thus, it is held at a different electric potential from that of the inlet electrode 32 and the outlet electrode 36. The respective electrodes 32, 34, and 36 each individually has a shape corresponding to the shape of the ion beam 4 like a tube or a parallel plate.

The electrostatic lens 30 acts as an einzel lens (which is also referred to as a unipotential lens) It has a function of narrowing the ion beam 4 in the Y direction without changing energy of the ion beam 4 even when the intermediate electrode 34 is applied with either direct current voltage $V_1$ of positive or negative polarity. Incidentally, FIG. 18 shows the state in which the ion beam 4 has not been narrowed for simplification of showing. However, the ion beam 4 is narrowed in actuality.

With the foregoing technique of narrowing the ion beam 4 by the use of the electrostatic lens 30, it is possible to compensate for the divergence in the Y direction due to the space charge effect of the ion beam 4, and to enhance the transport efficiency of the ion beam 4. However, unfavorably, energy contamination occurs like mixing of undesirable energy particles.

When the intermediate electrode 34 of the electrostatic lens 30 is applied with a negative direct current voltage $V_1$, the ion beam 4 is once accelerated in a region between the inlet electrode 32 and the intermediate electrode 34, and then, decelerated in a region between the intermediate electrode 34 and the outlet electrode 36 to return to the original energy. In this acceleration region, when the ion beam 4 collides with residual gases, and neutral particles are generated due to charge conversion, neutral particles having a higher energy than the energy of the incident ion beam 4 are generated. These neutral particles proceed toward the downstream side, which causes the energy contamination of a high energy component.

When the intermediate electrode 34 is applied with a positive direct current voltage $V_1$ as shown in FIG. 18, the ion beam 4 is once decelerated in a region between the inlet electrode 32 and the intermediate electrode 34, and then, accelerated in a region between the intermediate electrode 34 and the outlet electrode 36 to return to the original energy. In this deceleration region, when the ion beam 4 collides with residual gases, and neutral particles are generated due to charge conversion, neutral particles having a lower energy than the energy of the incident ion beam 4 are generated. These neutral particles proceed toward the downstream side, which causes the energy contamination of a low energy component.

Consequently, energy contamination occurs even when the intermediate electrode 34 is applied with either direct current voltage $V_1$ of positive or negative polarity.

Whereas, when the intermediate electrode 34 is applied with a positive direct current voltage $V_1$, as shown in FIG. 18, electrons 39 in an electric field-free drift space where an electric field doesn't exist space on the upstream side and on the downstream side of the vicinity of the intermediate electrode 34) are attracted to the intermediate electrode 34, and vanish. Therefore, when the amount of electrons in the drift space decreases, the divergence due to the space charge effect of the ion beam 4 is intensified. As a result, the transport efficiency of the ion beam 4 decreases.

SUMMARY OF INVENTION

One or more embodiments of the invention provide an ion implantation apparatus capable of compensating a divergence in a Y direction due to a space charge effect of an ion beam, and the like, and enhancing a transport efficiency of the ion beam, and further inhibiting an occurrence of an energy contamination.

In accordance with one or more embodiments of the invention, in an ion implantation apparatus of a first aspect of the invention, an ion beam formed in a ribbon-shape having a larger dimension in an X direction than a dimension in a Y direction substantially orthogonal to the X direction is irradiated onto a target. The ion implantation apparatus is provided with first and second magnets provided on an upstream side of the target, facing to each other in the Y direction across a path for the ribbon-shaped ion beam, and crossing a traveling direction of the ribbon-shaped ion beam. In the ion implantation apparatus, each of the first and second magnets has a pair of magnetic poles on an inlet side and on an outlet side of the ion beam, and polarities thereof are opposite between the first magnet and the second magnet. The first and second magnets generate magnetic fields in a direction so that an inward Lorentz force is applied to the ion beam between both the magnets, and the ion beam is narrowed in the Y direction.

In the first aspect of the invention, the ribbon-shaped ion beam may be formed by scanning the ion beam in the X direction or by not scanning in the X direction.

According to the ion implantation apparatus of the first aspect, it is possible to generate magnetic fields each having a component orthogonal to the traveling direction of the ion beam over an entire region in the X direction of the ribbon-shape ion beam by the first and second magnets (however, the magnetic fields generated by both the magnets are opposite from each other). By the magnetic fields, the ion beam receives inward Lorentz forces in the Y direction. As a result, the ion beam can be narrowed in the Y direction.

According to a second aspect of the invention, in the ion implantation of the first aspect, the first and second magnets may be arranged substantially plane symmetrically with respect to a symmetric plane passing through a center in the Y direction of the path for the ion beam and substantially orthogonal to the X direction and the Y direction, except that the first magnet and the second magnet are opposite in polarity from each other.

According to a third aspect of the invention, in the ion implantation apparatus of the first or second aspect, the first and second magnets may be arranged so as to obliquely cross the traveling direction of the ion beam.

According to a fourth aspect of the invention, in the ion implantation apparatus of the first or second aspect, the first and second magnets may be provided on a path for the ion beam where the ion beam is scanned in a fan shape in the X direction, the first and second magnets may respectively have arc shapes protruding in the traveling direction the ion beam, such that an angle formed between the advancing direction of the ion beam at each scanning position in the X direction and a straight line connecting between the pair of the magnetic poles of each magnet at the shortest distance is invariably substantially constant.

According to a fifth aspect of the invention, the ion implantation apparatus of the first or second aspect may include an ion beam deflector configured to deflect the ion beam which is in an energy state so as to be irradiated onto the target by a magnetic field or an electric field, and separate the ion beam and neutral particles. Further, in the ion implantation apparatus of the fifth aspect, the first and second magnets may be disposed in at least a vicinity on a downstream side of the ion beam deflector. In contrast, in the ion implantation apparatus of the fifth aspect, the first and second magnets may be disposed in at least a vicinity on an upstream side of the ion beam deflector.

According to a sixth aspect of the invention, in the ion implantation apparatus of one of the first to fifth aspects, the first and second magnets may be permanent magnets.

According to a seventh aspect of the invention, in the ion implantation apparatus of one of the first to fifth aspects, the first and second magnets may be electromagnets.

In accordance with the first aspect of the invention, the ion beam may be narrowed in the Y direction by the magnetic fields generated by the first and second magnets. Therefore, it is possible to compensate for the divergence in the Y direction due to the space charge effect of the ion beam, or the like, and to enhance the transport efficiency of the ion beam.

Further, the ion beam may be narrowed without acceleration and deceleration instead of the case using an electrostatic lens. Therefore, it is possible to inhibit the occurrence of energy contamination.

Still further, the foregoing effect may be produced with a simple structure of the first and second magnets.

In accordance with the second aspect of the invention, magnetic fields with good symmetry with respect to the symmetric surface may be generated by the first and second magnets. Therefore, it is possible to narrow the ion beam with good symmetry.

In accordance with the third aspect of the invention, the magnetic component orthogonal to the traveling direction of the ion beam is made larger, which may narrow the ion beam in the Y direction more strongly.

In accordance with the fourth aspect of the invention, the ion beam may be narrowed uniformly in the Y direction over the entire region of the ion beam to be scanned in a fan shape in the X direction.

In accordance with the fifth aspect of the invention, the first and second magnets are permanent magnets. Therefore, the configuration may be more simplified.

In accordance with the sixth aspect of the invention, the first and second magnets are electromagnets. It is easy to adjust the intensities of the magnetic fields generated from the first and second magnets. Accordingly, it is possible to control the degree to which the ion beam is narrowed in the Y direction with ease. Further, it is also possible to generate a more intense magnetic field than with a permanent magnet, and thereby to narrow the ion beam more strongly.

Other aspects and advantages of the invention will be apparent from the following description and the appended claims.

DETAILED DESCRIPTION OF THE EXEMPLARY EMBODIMENTS

Figure 1:
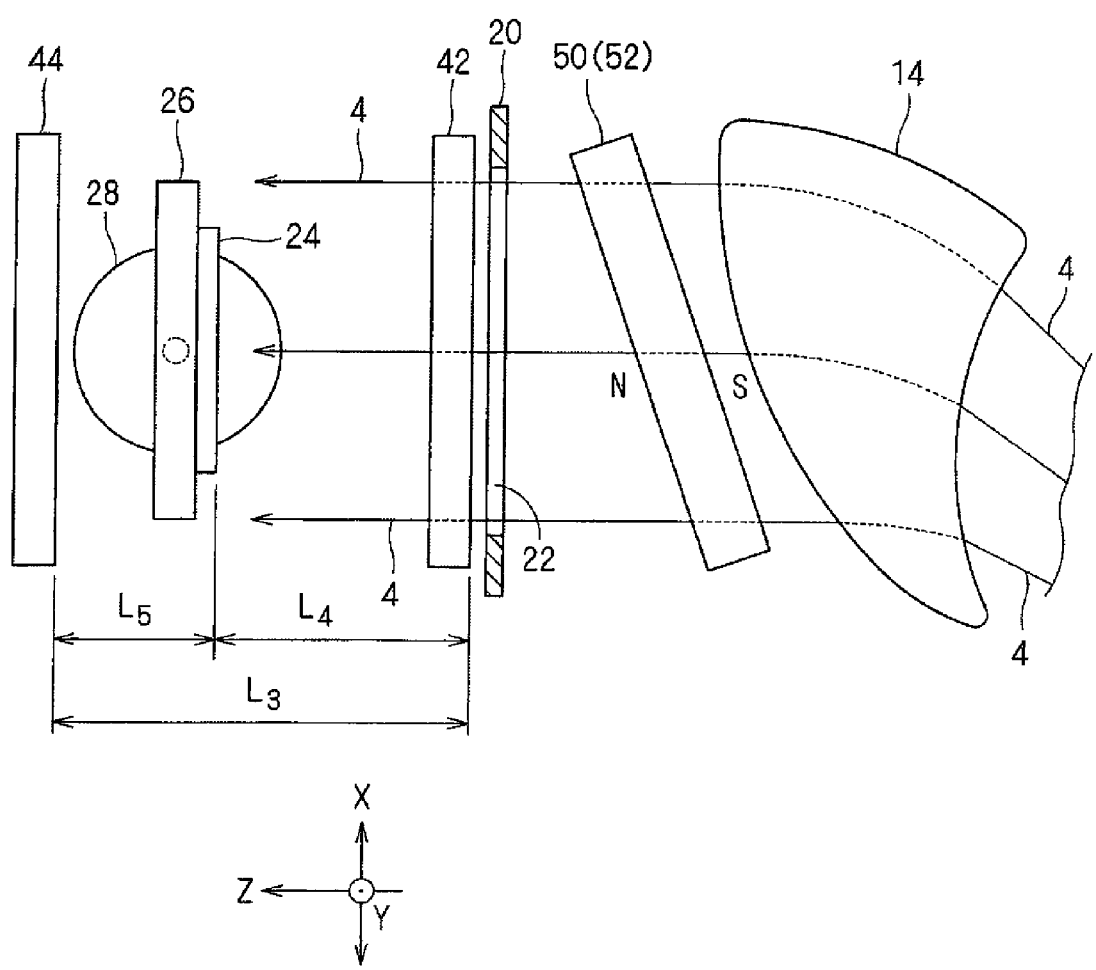
[FIG. 1] A plan view partially showing one exemplary embodiment of an ion implantation apparatus in accordance with this invention.
Figure 16:
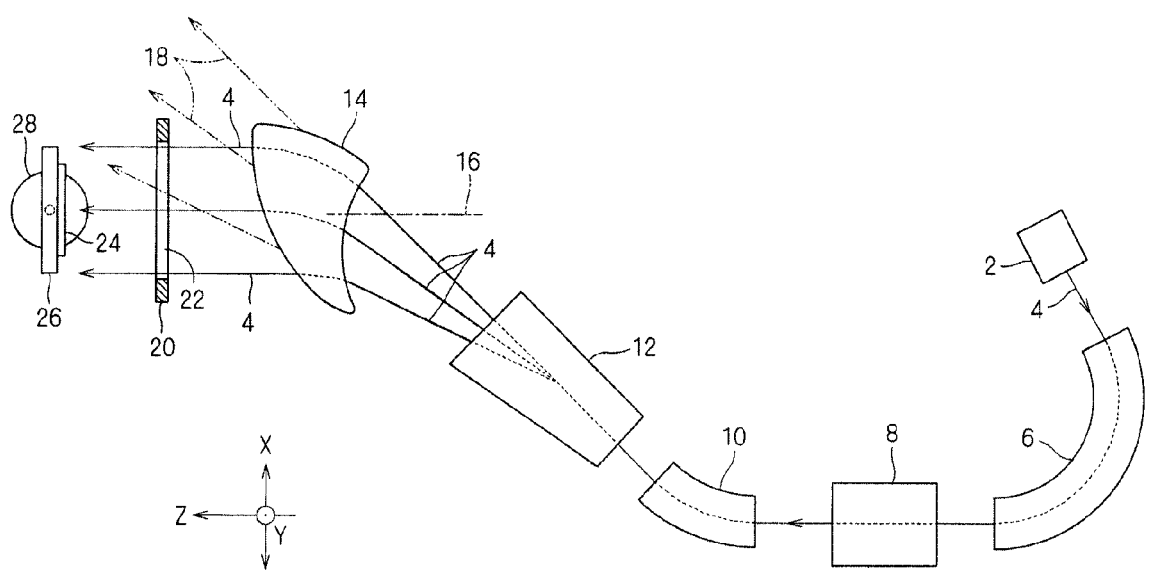
[FIG. 16] A plan view showing ion implantation apparatus according to a related art.
Figure 17:
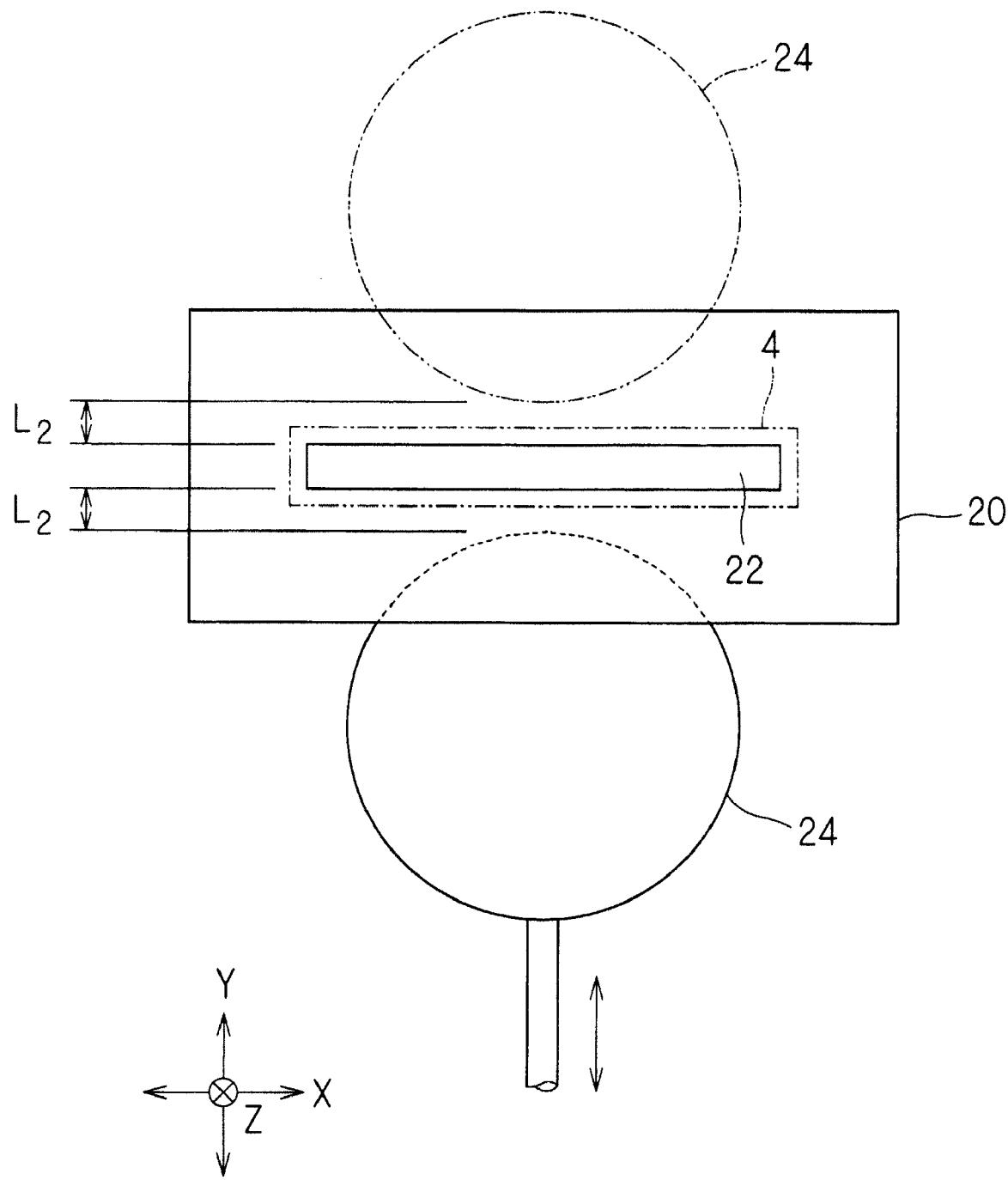
[FIG. 17] A front view showing a mask and a target in FIG. 16 as seen in the traveling direction of the ion beam on an enlarged scale.
Figure 18:
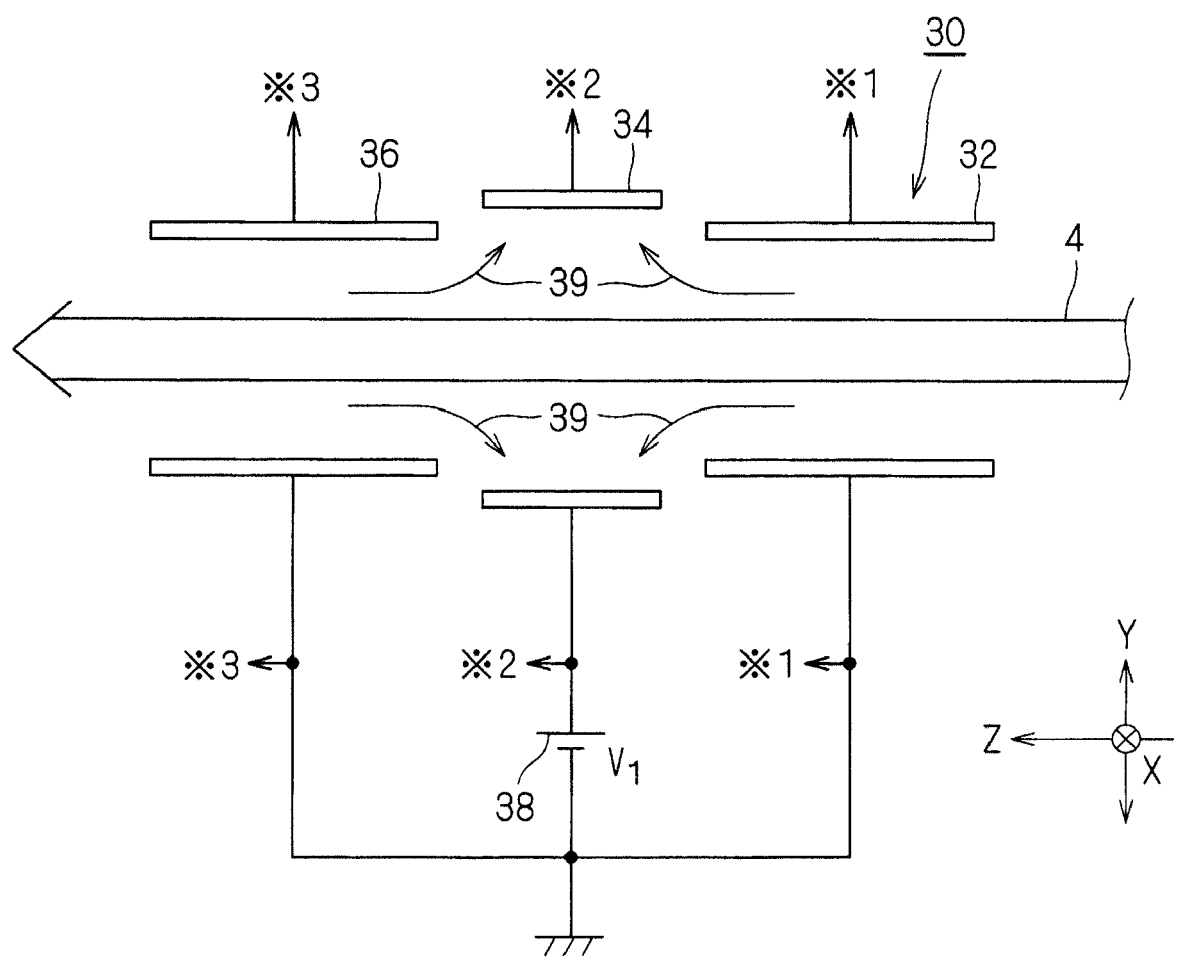
[FIG. 18] A side view showing one example of an electrostatic lens together with a power source.

FIG. 1 is a plan view partially showing one exemplary embodiment of an ion implantation apparatus in accordance with the invention. Elements which are equal to or correspond to those of a related art shown in FIG. 16 are given the same reference signs and numerals. Below, points of difference from the related art will be mainly described.

An ion implantation apparatus is disposed on an upstream side of a target 24. More specifically, the ion implantation apparatus is disposed in a vicinity of a downstream side of a collimator 14 also serving as an ion beam deflector for separating an ion beam 4 and the neutral particles 18 in FIG. 16. The ion implantation apparatus has a first magnet 50 and a second magnet 52 disposed so as to face each other in a Y direction across a path for a ribbon-shaped ion beam 4. In FIG. 1, the second magnet 52 (see, FIG. 3) is hidden under the first magnet 50, and does not appear. Therefore, a reference numeral 52 thereof is described in parentheses.

Incidentally, on the downstream side of the collimator 14, the scanner 12 and the collimator 14 cooperate. Accordingly, the ion beam 4 is substantially scanned in parallel in the X direction, and the ion beam 4 has a ribbon-shape.

The first and second magnets 50 and 52 are respectively permanent magnets substantially having straight shapes, in this exemplary embodiment.

Both the magnets 50 and 52 are disposed as to cross a traveling direction Z of the ribbon-shaped ion beam 4. More specifically, the magnets 50 and 52 is disposed so as to obliquely cross the traveling direction Z, in this exemplary embodiment. Further, both the magnets 50 and 52 each has a length covering a dimension in the X direction of the ribbon-shaped ion beam 4, in this exemplary embodiment. Namely, both the magnets 50 and 52 each has a larger dimension in the X direction than the dimension in the X direction of the ribbon-shaped ion beam 4, and has a shape of a long narrow rod or plate.

Figure 2:
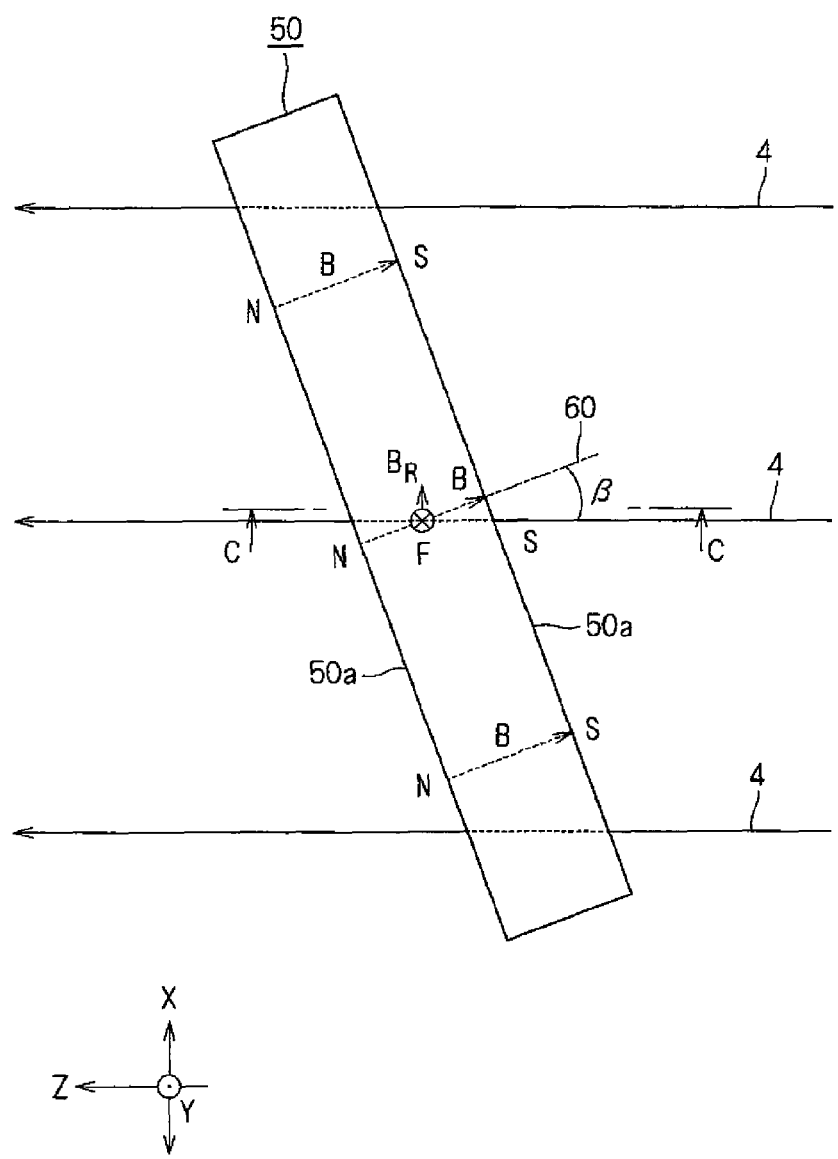
[FIG. 2] A plan view showing a first magnet and an ion beam shown in FIG. 1 on an enlarged scale.
Figure 6:
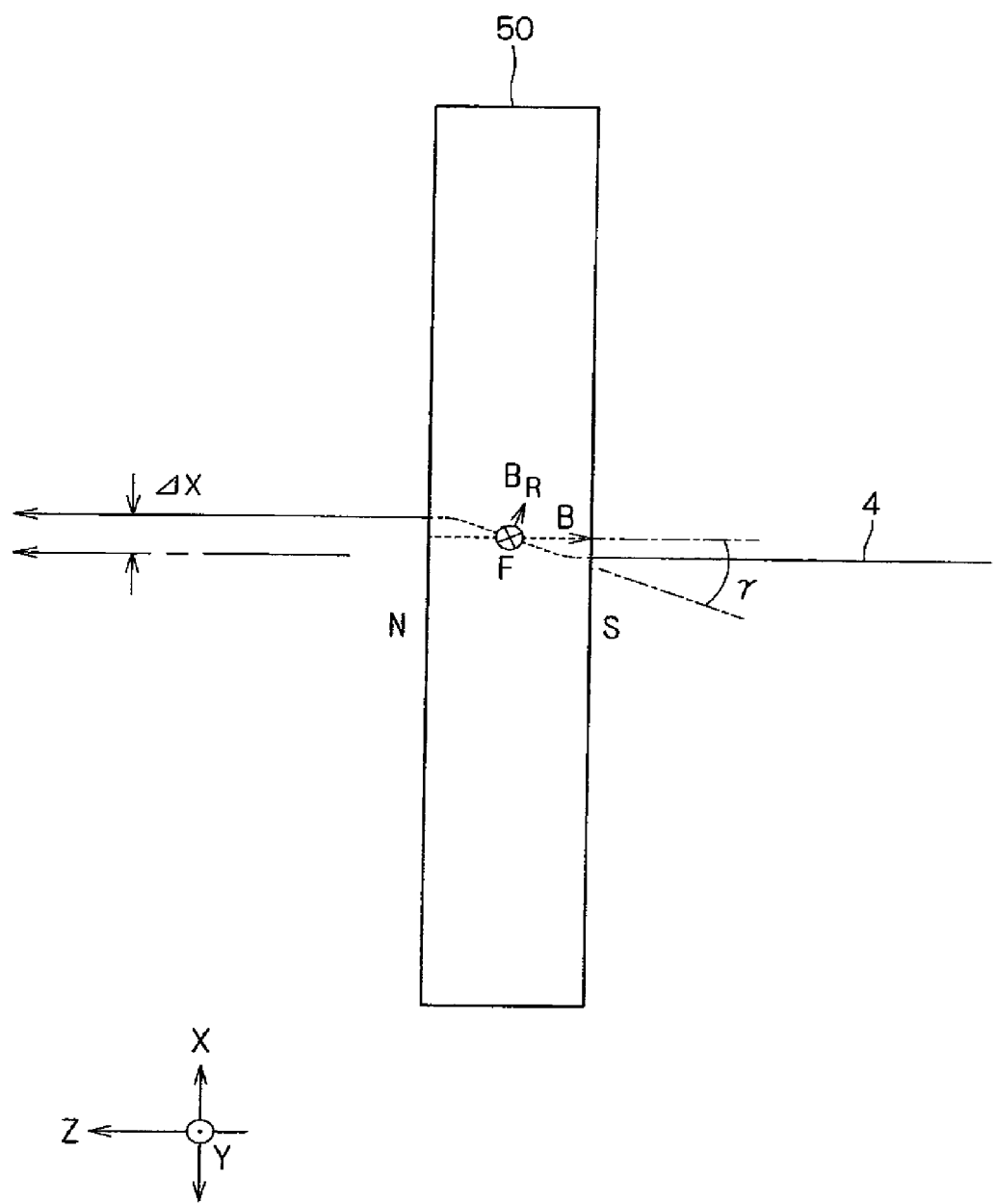
[FIG. 6] A plan view showing an another exemplary embodiment in which the first magnet is disposed substantially at right angles with the ion beam, the ion beam being shown with only one line as a typical one.

The wording "obliquely cross" means that the angle β formed between a normal 60 drawn to a long side 50a of the magnet 50 and the traveling direction Z of the ion beam 4 is other than 0 degree as shown in FIG. 2. The normal 60 is, in other words, a line parallel with a short axis or a magnetic axis of the magnet 50. When the angle β is 0 degree, as shown in FIG. 6, the magnet 50 crosses at substantially right angles with the traveling direction of the ion beam 4. The same applies to the second magnet 52.

Figure 14:
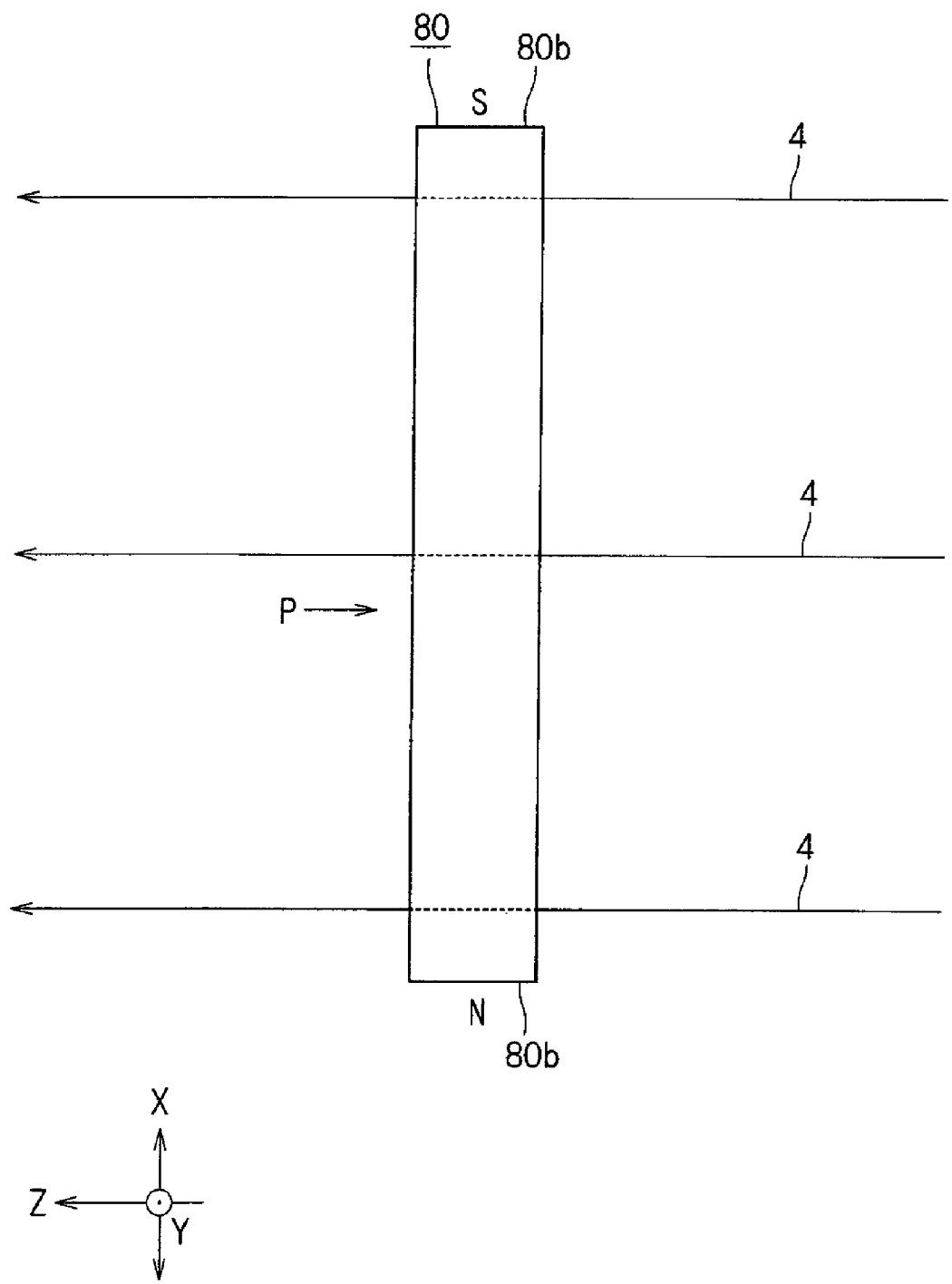
[FIG. 14] A plan view showing an example of the first magnet having magnetic poles on opposite sides in the longitudinal direction and the ion beam as a reference example.
Figure 15:
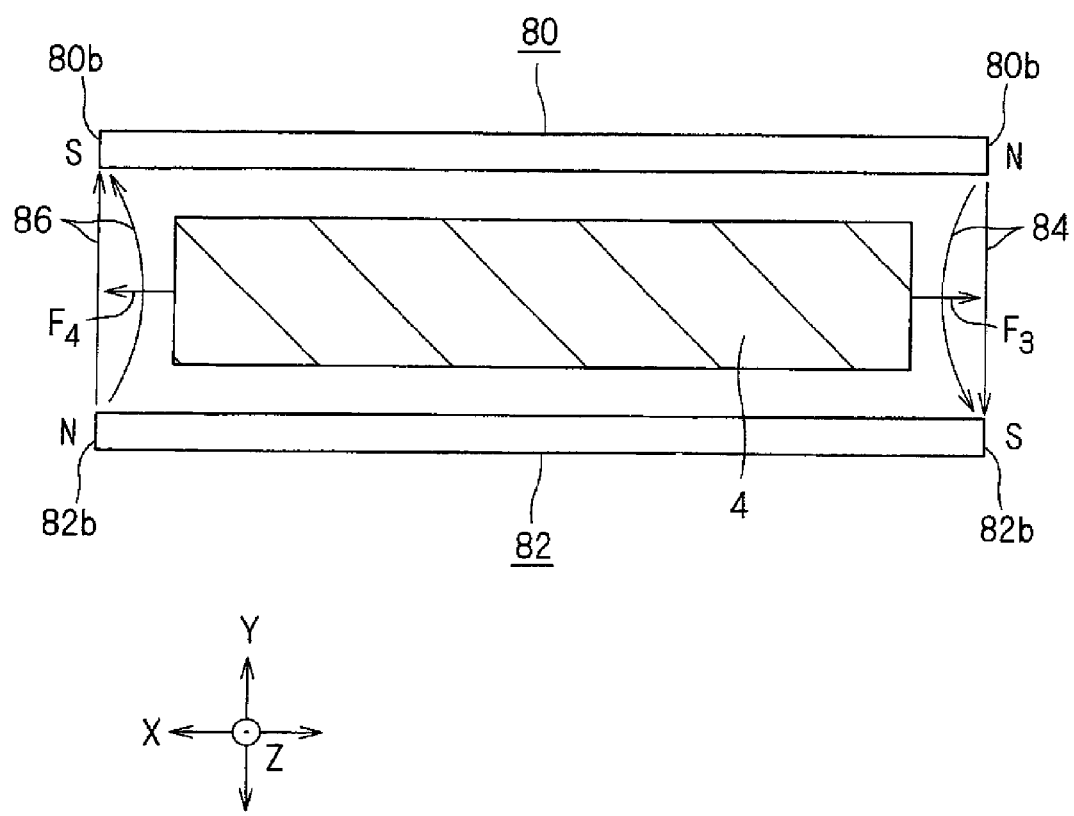
[FIG. 15] A front view showing the first magnet, the ion beam, and the second magnet shown in FIG. 14 as seen in the direction of an arrow P in FIG. 4.

Both the magnets 50 and 52 each has a pair of magnetic poles which are N pole and S pole on an inlet side and on an outlet side of the ion beam 4. Namely, the two long sides 50a, 52a are respectively substantially magnetic poles over the overall length thereof. In other words, opposite sides in a direction of each short side of the magnets 50 and 52 are magnetic poles. In this regard, this exemplary example is largely different from a reference example in which short sides 80b, 82b are magnetic poles as shown in FIGS. 14 and 15. Further, the polarities of the magnetic poles are opposite between the first magnet 50 and the second magnet 52 as shown in FIG. 3.

Figure 3:
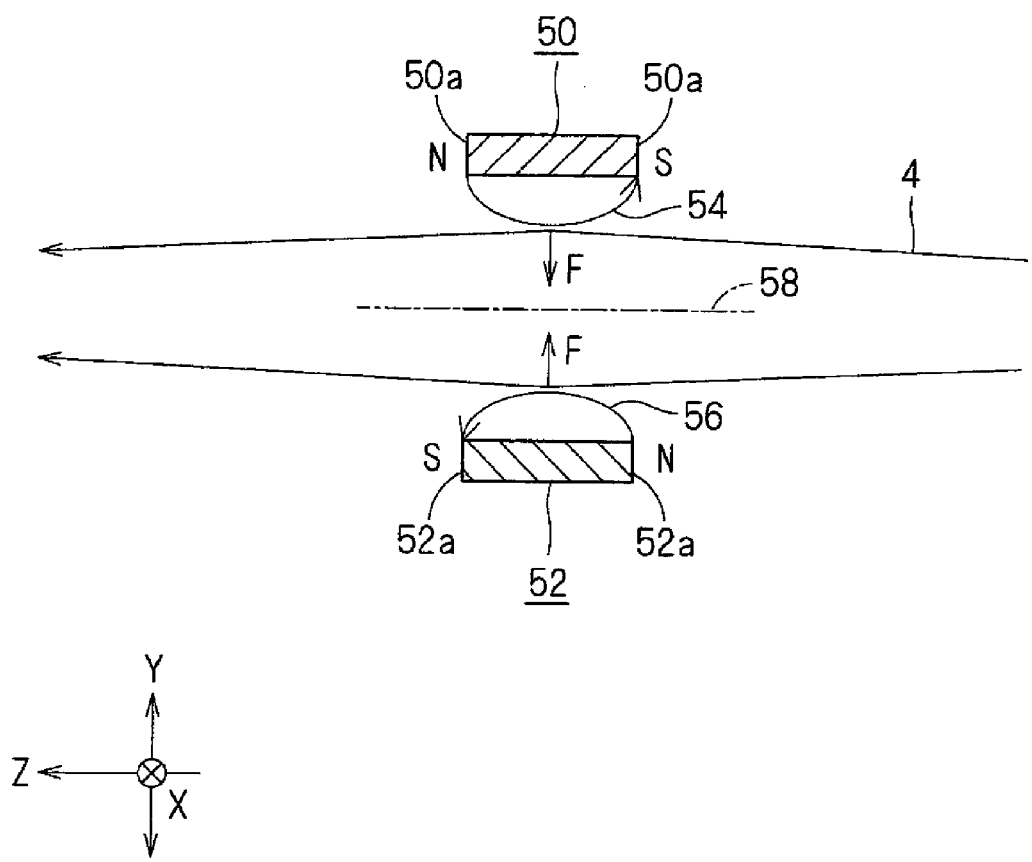
[FIG. 3] A cross sectional view showing the first magnet, a second magnet, and an ion beam generally along line C-C of FIG. 2.

Further, in this exemplary embodiment, the first magnet 50 and the second magnet 52 are disposed substantially plane symmetrically with respect to a symmetric surface 58 passing through a center in the Y direction of the path for the ion beam 4, and substantially orthogonal to the X direction and the Y direction in FIG. 3. More specifically, the magnet 50 and the magnet 52 are configured to substantially have mutually equal shape and dimensions. Both the magnets 50 and 52 are disposed to substantially face each other in the Y direction. In other words, these magnets are overlapped one on another in the Y direction. In addition, the distances between the symmetric surface 58 and both the magnets 50 and 52 are set to be mutually substantially equal. Therefore, in a vicinity of the symmetric surface 58, the upper and lower magnetic fields cancel each other, so that the intensity of the magnetic field becomes substantially 0. Thus, the intensity of the magnetic field increases with an increase in distances upward and downward in the Y direction from the symmetric surface 58.

The relationship between the setting sites and the polarities of the magnetic poles of both the magnets 50 and 52 are summarized in Table 1. The embodiment shown in FIG. 1 corresponds to Example 1 in Table 1. Example 2 will be described later.

TABLE 1

|  | Setting site of magnet | Polarity on the outlet side of first magnet 50 | Polarity on the outlet side of second magnet 52 |
| --- | --- | --- | --- |
| Example 1 | Downstream side of collimator 14 | N pole | S pole |
| Example 2 | Upstream side of collimator 14 | S pole | N pole |

Figure 8:
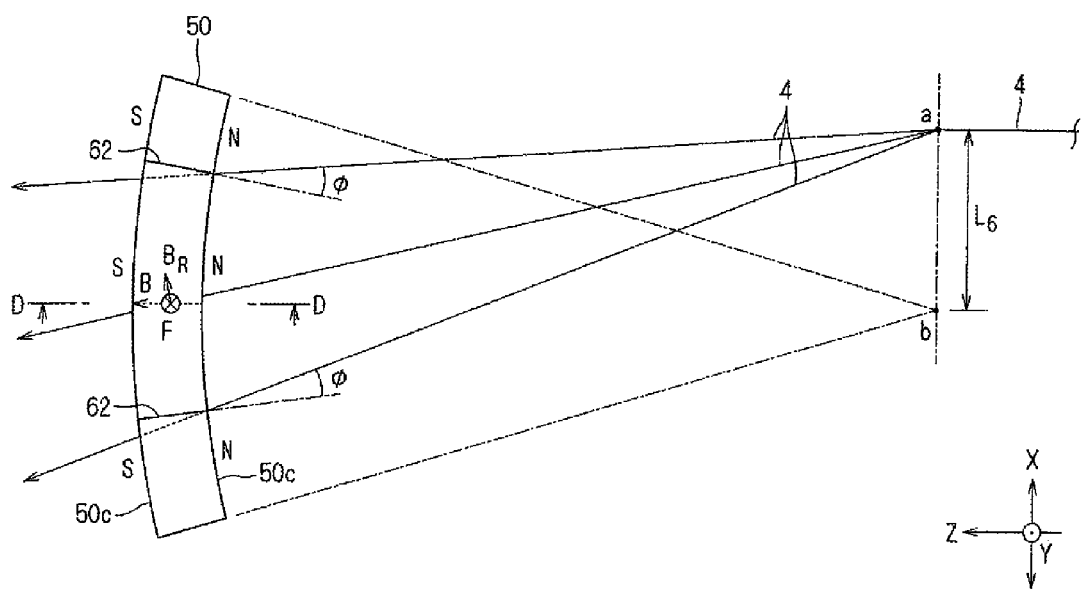
[FIG. 8] A plan view showing an another exemplary embodiment in which the first and second magnets are disposed in the vicinity of the upstream side of a collimator shown in FIG. 1.

The table 1 shows the case where the angle β is positive (however, smaller than 90 degrees) when the angle β is taken counterclockwise with respect to the incident ion beam 4 as shown in FIG. 2. Further, it shows the case where the angle γ shown in FIG. 6 is positive (however, smaller than 90 degrees) when the angle γ is taken clockwise with respect to the incident ion beam 4. Similarly, it shows the case where the angle shown in FIG. 8 is positive (however, smaller than 90 degrees) when the angle φ is taken clockwise with respect to the incident ion beam 4. When the angles β, γ, and φ are negative, the orientation of the orthogonal component $B_R$ described later is reversed. For this reason, it is essential only that the polarities of the magnets 50 and 52 are reversed from those shown in Table 1. In other words, in any case, the polarities of the magnetic poles of both the magnets 50 and 52 are set so as to cause magnetic fields in the direction in which Lorentz force is allowed to act on the ion beam 4 inwardly between both the magnets 50 and 52.

This will be first described by reference to FIGS. 2 and 3. The first magnet 50 generates a magnetic field B in the direction crossing the ion beam 4 at the angle on the side of the path for the ion beam 4. The magnetic field B generated by the magnet 50 is schematically shown with a line of magnetic field 54 in FIG. 3. Distinct from the case of the reference example shown in FIG. 14 or 15, the magnetic pole of the magnet 50 is present in the direction of short side. Therefore, it is possible to generate the magnetic field B as described above.

The magnetic field B has a component (orthogonal component) $B_R$ orthogonal to the traveling direction Z of the ion beam 4 due to the presence of the angle β. Such an orthogonal component $B_R$ occurs over the entire region in the X direction of the ion beam 4. By the orthogonal component $B_R$, the ion beam 4 receives inward Lorentz force F in the Y direction (downward in FIG. 3).

The second magnet 52 also generates the same magnetic field as the magnetic field B generated by the first magnet 50 except that the orientation is reverse. The magnetic field generated by the magnet 52 is schematically shown with a line of magnetic field 56 in FIG. 3. By the orthogonal component of the magnetic field, the ion beam 4 receives Lorentz force F acting inward in the Y direction (downward in FIG. 3).

By the Lorentz force F, the ion beam 4 may be narrowed in the Y direction. The degree to which the ion beam 4 is narrowed is proportional to the magnetic flux density of the magnetic field B, and is inversely proportional to the energy of the ion beam 4. Therefore, when the magnetic flux density is constant, an ion beam 4 with a lower energy may be more strongly narrowed.

One example of the state in which the ion beam 4 is narrowed is shown in FIG. 3. This is an example in which the incident ion beam 4 diverging in the Y direction is narrowed so as to converge. However, the state of the ion beam 4 shown is only one example (the same also applies to FIGS. 4, 9, 11, and 13). Adjustment of the degree to which the ion beam 4 is narrowed enables other narrowing techniques than the foregoing example. For example, it is also possible to lead out a parallel ion beam of which divergence is substantially 0 in the Y direction. The same also applies to other embodiments described later.

Thus, with the ion implantation apparatus, the ion beam 4 may be narrowed in the Y direction by the magnetic fields generated by the first and second magnets 50 and 52. Therefore, it is possible to compensate for the divergence in the Y direction due to the space charge effect of the ion beam 4, and to enhance the transport efficiency of the ion beam 4 to the target 24.

It is possible to narrow the ion beam 4 in the Y direction. Therefore, it is also possible to inhibit the divergence in the Y direction due to other factors than the space charge effect of the ion beam 4. Further, as described previously, by adjusting the degree to which the ion beam 4 is narrowed in the Y direction, it becomes also possible to lead out a parallel ion beam of which divergence is substantially 0 in the Y direction.

Taking a more specific example, when the mask 20 is disposed on the downstream side of both the magnets 50 and 52 as with the example shown in FIG. 1, the following is possible: Between the collimator 14 and the mask 20, the divergence in the Y direction due to the space charge effect of the ion beam 4 is compensated. This increases the amount of the ion beam 4 to pass through the opening 22 of the mask 20, resulting in an increase in transport efficiency of the ion beam 4 to the target 24.

Whereas, distinct from the case using an electrostatic lens, it is possible to narrow the ion beam 4 without acceleration or deceleration. Therefore, it is possible to inhibit the occurrence of energy contamination.

Further, it is possible to exert the effect with a simple configuration of the first and second magnets 50 and 52.

This exemplary embodiment further has the following advantage.

Namely, both the magnets 50 and 52 are permanent magnets, and hence the configuration may be more simplified.

Both the magnets 50 and 52 are arranged so as to obliquely cross with the traveling direction Z of the ion beam 4. Therefore, it is possible to make the orthogonal component $B_R$ larger, and to more strongly narrow the ion beam in the Y direction.

Both the magnets 50 and 52 are disposed along the path for the ion beam 4 substantially parallelly scanned in the X direction. Therefore, it is possible to uniformly narrow the ion beam 4 in the Y direction over the entire region of the ion beam 4 substantially parallelly scanned in the X direction.

The first magnet 50 and the second magnet 52 are substantially arranged plane symmetrically with respect to the symmetric surface 58, so that a magnetic field with good symmetry with respect to the symmetric surface 58 may be generated by the first and second magnets 50 and 52. Therefore, the ion beam 4 may be narrowed with good symmetry.

Figure 4:
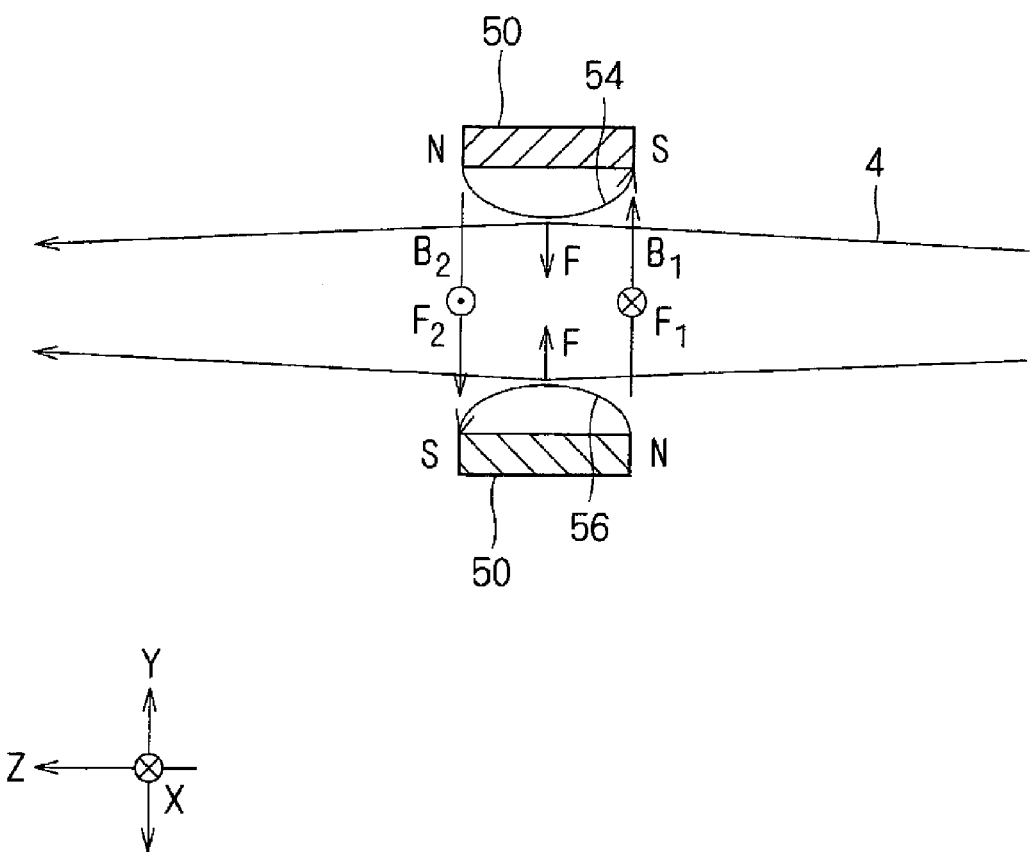
[FIG. 4] A view in which a magnetic field in the Y direction is added to FIG. 3

Incidentally, between the magnetic poles of the first magnet 50 and the magnetic poles of the second magnet 52, strictly, magnetic fields $B_1$ and $B_2$ in the Y direction occur as with the example shown in FIG. 4. Both the magnetic fields $B_1$ and $B_2$ are mutually oppositely oriented. Further, these are intensified with a decrease in distance in the Y direction between both the magnets 50 and 52. By the magnetic fields $B_1$ and $B_2$, the ion beam 4 receives Lorentz forces $F_1$ and $F_2$ acting in the mutually opposite directions in the X direction. Thus, the ion beam 4 is bent in the X direction during passage through between both the magnets 50 and 52. As a result, a difference in orbit (orbit difference) $\Delta X$ in the X direction is caused between the inlets and the outlets of the magnets 50 and 52. When the intensities of both the magnetic fields $B_1$ and $B_2$ are made substantially equal to each other, the incident ion beam 4 and the irradiation ion beam 4 become substantially parallel to each other. Even when the orbit difference $\Delta X$ as described above is caused, the object of narrowing the ion beam 4 in the Y direction may be attained. Further, the orbit difference $\Delta X$ as described above is generally very small. Therefore, even when the orbit difference $\Delta X$ is caused, no particular inconvenience is caused. However, when inconvenience arises, it is possible to cope with it with other means.

Figure 5:
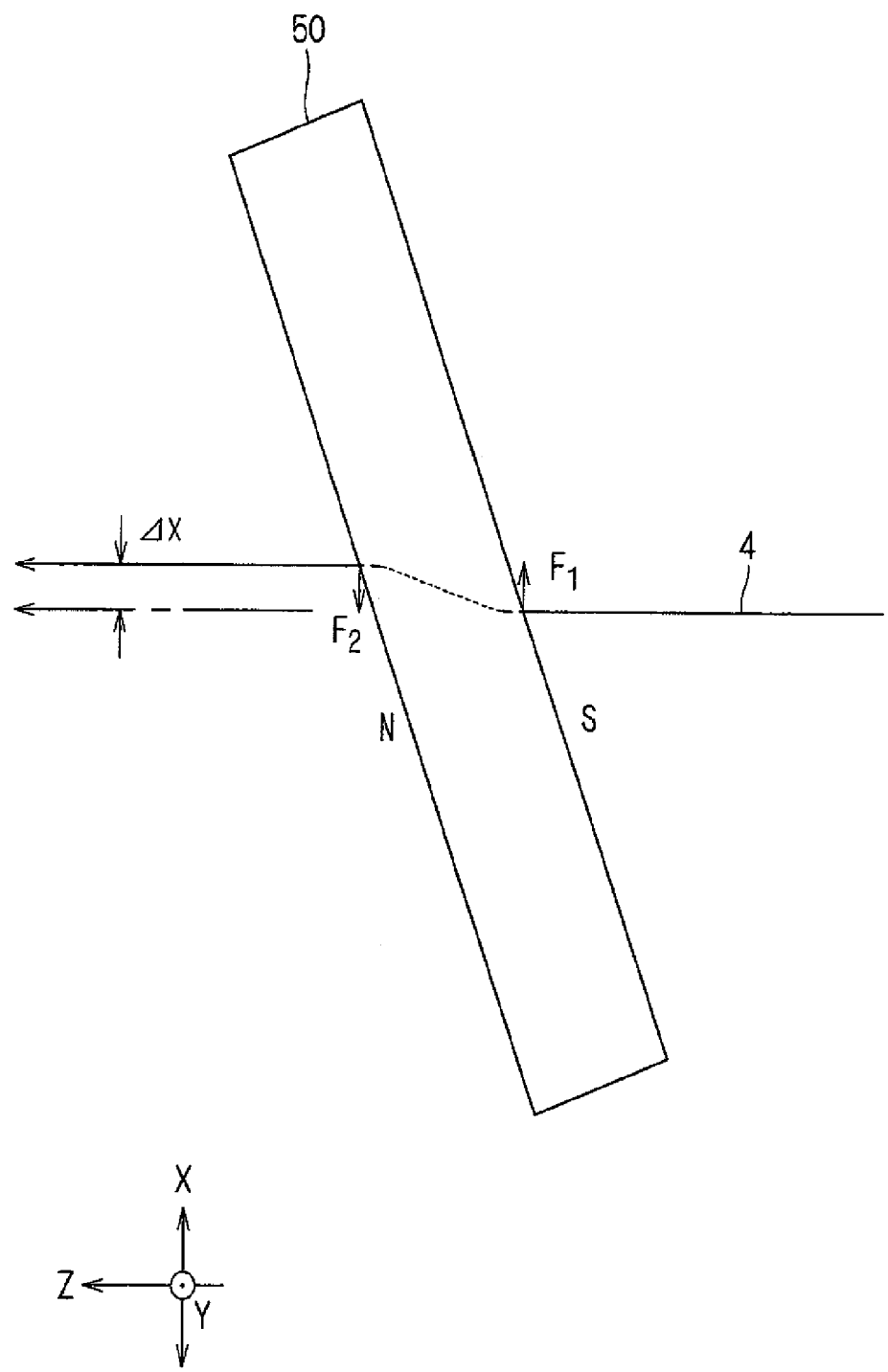
[FIG. 5] A plan view showing a deviation of an orbit in the X direction of the ion beam on an enlarged scale, the ion beam being shown with only one line as a typical one.

Incidentally, in FIG. 5, only one line of the ion beam 4 is shown as the typical one. However, the ion beams 4 at other sites are also the same as the one shown (the same also applies to FIGS. 6 and 12).

Whereas, noticing that the ion beam 4 is bent in the X direction during passage through between both the magnets 50 and 52 as described above, as with the example shown in FIG. 6, the magnets 50 and 52 may also be disposed so as to cross substantially at right angles with respect to the traveling direction Z of the ion beam 4 (in other words, so that the angle β shown in FIG. 2 becomes substantially 0 degree). Also in this case, the angle γ formed between the ion beam 4 passing through between the magnets 50 and 52 and the magnetic field B is larger than 0 degree. Thus, the component (orthogonal component) $B_R$ orthogonal to the traveling direction Z of the ion beam 4 occurs. Therefore, by the orthogonal component $B_R$, as with the case of the example of FIG. 2 or 3, the ion beam 4 receives Lorentz force acting inward in the Y direction (however, the magnitude thereof is generally smaller than in the example of FIG. 2 or 3). As a result of this, it is possible to narrow the ion beam 4 in the Y direction.

The same phenomenon as this also occurs in the example of FIG. 2 or 3, to be exact, as indicated by reference to FIG. 5. Therefore, also noticing the angle γ, the angle formed between the ion beam 4 during passage through between the magnets 50 and 52 and the magnetic field B is β+γ.

Figure 7:
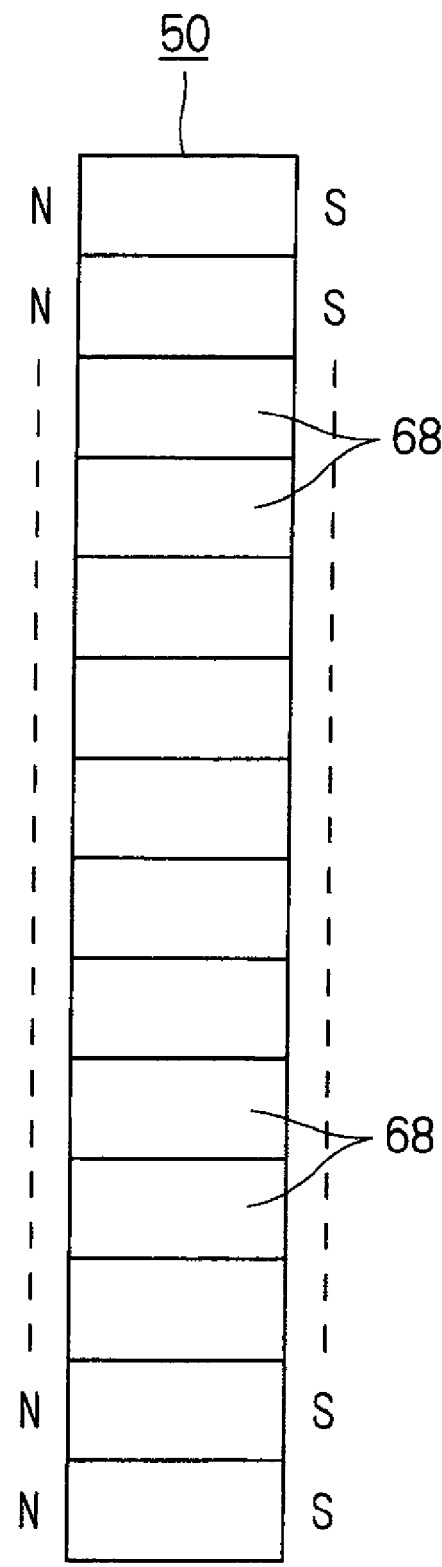
[FIG. 7] A plan view showing an another exemplary example in which the first magnet is formed of a plurality of permanent magnets arranged.

The magnet 50 may be formed of one permanent magnet. Alternatively, it may be formed by arranging a plurality of permanent magnets 68 of the same polarity in parallel as with the example shown in FIG. 7. The same also applies to the magnet 52. Further, the same also applies to the magnets 50 and 52 in the form of an arc (see, FIGS. 8 and 9) described later.

Incidentally, it is not preferable that magnetic poles are disposed on the opposite sides in the longitudinal direction of a first magnet 80 and a second magnet 82, namely, on the two short sides 80b and 82b sides as with a reference example shown in FIGS. 14 and 15. When the magnetic poles are provided in such a configuration, between both the magnets 80 and 82, magnetic force lines 84 and 86 along the Y direction occur only in the vicinity of the magnetic poles on the opposite sides in the X direction as shown in FIG. 15. As a result, Lorentz forces $F_3$ and $F_4$ for diverging the ion beam 4 outward merely act on the vicinity of the opposite sides in the X direction of the ribbon-shaped ion beam 4. Thus, the ion beam 4 may not be narrowed in the Y direction.

The first and second magnets 50 and 52 may be disposed in the vicinity of the upstream side of the collimator 14 in place of being disposed in the vicinity of the downstream side of the collimator 14 as in the above exemplary embodiment. With such a configuration, it is possible to increase the amount of the ion beam 4 entering the collimator 14, and passing therethrough. Therefore, it becomes easy to enhance the transport efficiency of the ion beam 4.

The first and second magnets 50 and 52 may be disposed in at least one of, or may be disposed in both of the vicinity of the downstream side and the vicinity of the upstream side of the collimator 14. When these are disposed on both sides, it is possible to increase the amount of the ion beam 4 passing through the collimator 14. In addition, it is possible to inhibit the divergence in the Y direction of the ion beam passed through the collimator 14. Therefore, it is possible to more enhance the transport efficiency of the ion beam 4 to the target 24.

However the sites at which the first and second magnets 50 and 52 are disposed are not limited to the foregoing sites. These may be disposed anywhere so long as the sites are on the upstream side of the target 24. Even so, the following is possible: the ion beam 4 is narrowed in the Y direction, and the divergence due to the space charge effect of the ion beam 4, and the like is compensated. Thus, the transport efficiency of the ion beam 4 is enhanced. However, when the ion beam 4 in a ribbon-shape which has scanned in the X direction is irradiated onto the target 24 as with the example shown in FIG. 16, the magnets 50 and 52 are disposed on the downstream side of the scanner 12 for carrying out the scanning. When the ribbon-shaped ion beam 4 is generated from the ion source 2, and the ion beam 4 in a ribbon-shape without having been scanned in the X direction is irradiated onto the target 24, the scanner 12 is unnecessary, and hence there is no limitation as described above.

When the first and second magnets 50 and 52 are disposed in the path for the ion beam 4 to be scanned in a fan shape in the X direction by the scanner 12 (see, FIG. 16) as with the vicinity of the upstream side of the collimator 14, both the magnets 50 and 52 are each preferably formed in the one bent in an arc shape, namely formed in the following one in an arc shape.

Figure 9:
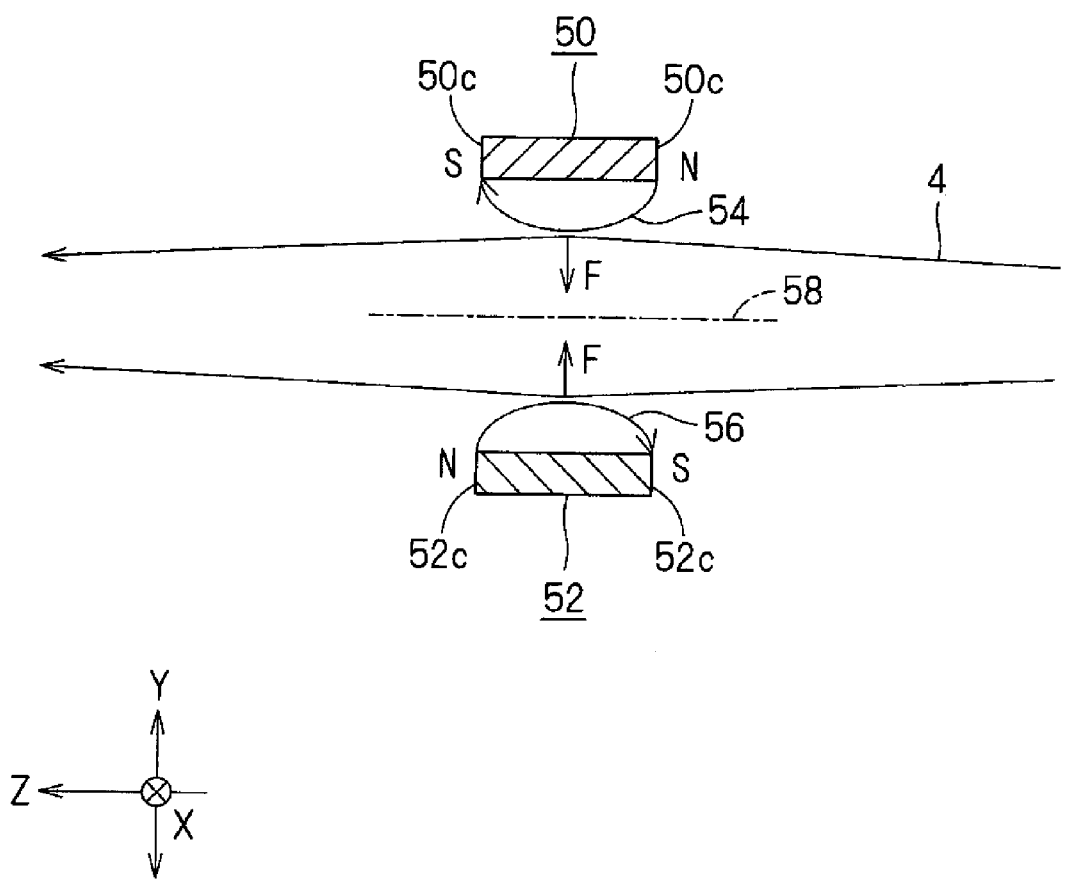
[FIG. 9] A cross sectional view showing the first magnet, the second magnet, and the ion beam generally along line D-D of FIG. 8.

In other words, both the magnets 50 and 52 are each in an arc shape protruding in the traveling direction of the ion beam 4 as with the embodiment shown in FIG. 8 or 9. They are each preferably formed in an arc shape so that the angle φ formed between the traveling direction of the ion beam 4 at each scanning position in the X direction and a straight line 62 connecting between a pair of magnetic poles (N pole and S pole) of each of the magnets 50 and 52 at the shortest distance is invariably substantially constant.

Specifically, two (i.e., the inlet side and the outlet side of the ion beam 4) arc-like sides 50c and 52c are each configured to be a part of a circle centering on a point b, where b denotes a point away at a distance $L_6$ in the X direction from a center point a in which a denotes the center point of scanning of the ion beam 4 by the scanner 12. The arc-like sides 50c and 52c are respectively substantially magnetic poles over the overall length thereof.

When both the magnets 50 and 52 are each formed in the foregoing arc shaper the angle φ substantially becomes constant regardless of the scanning position of the ion beam 4. By the angle φ (to be exact, with the angle γ described by reference to FIG. 6 added), the magnetic field B generated by both the magnets 50 and 52 has a component (orthogonal component) $B_R$ orthogonal to the traveling direction of the ion beam 4. By the orthogonal component $B_R$, the ion beam 4 receives inward Lorentz force F in the Y direction. As a result, the ion beam 4 may be narrowed in the Y direction. The angle φ increases with an increase in the distance $L_6$.

Further, the angle φ substantially becomes constant regardless of the scanning position of the ion beam 4. Therefore, the ion beam 4 may be narrowed uniformly in the Y direction over the entire region of the ion beam 4 to be scanned in a fan shape in the X direction.

Example 2 in the table 1 corresponds to the embodiment shown in FIGS. 8 and 9.

When a ribbon-shaped ion beam 4 is generated from the ion source 2 (see, FIG. 16), and the ion beam 4 in a ribbon-shape is irradiated onto the target 24 without having been scanned in the X direction, the first and second magnets 50 and 52 each in a substantially straight form described by reference to FIGS. 1 to 7 described above may be disposed in the path for the ion beam 4. With such a configuration, it is possible to uniformly narrow the ion beam 4 in the Y direction over the entire region of the X direction of the ion beam 4.

The first and second magnets 50 and 52 each in a straight or arc shape as described above may be formed of an electro-magnet in place of being formed of a permanent magnet as with the embodiment. The embodiment of the case in which the magnets 50 and 52 are formed of an electromagnet will be described mostly for the differences from the embodiment in which the first and second magnets 50 and 52 are each formed of a permanent magnet.

Figure 10:
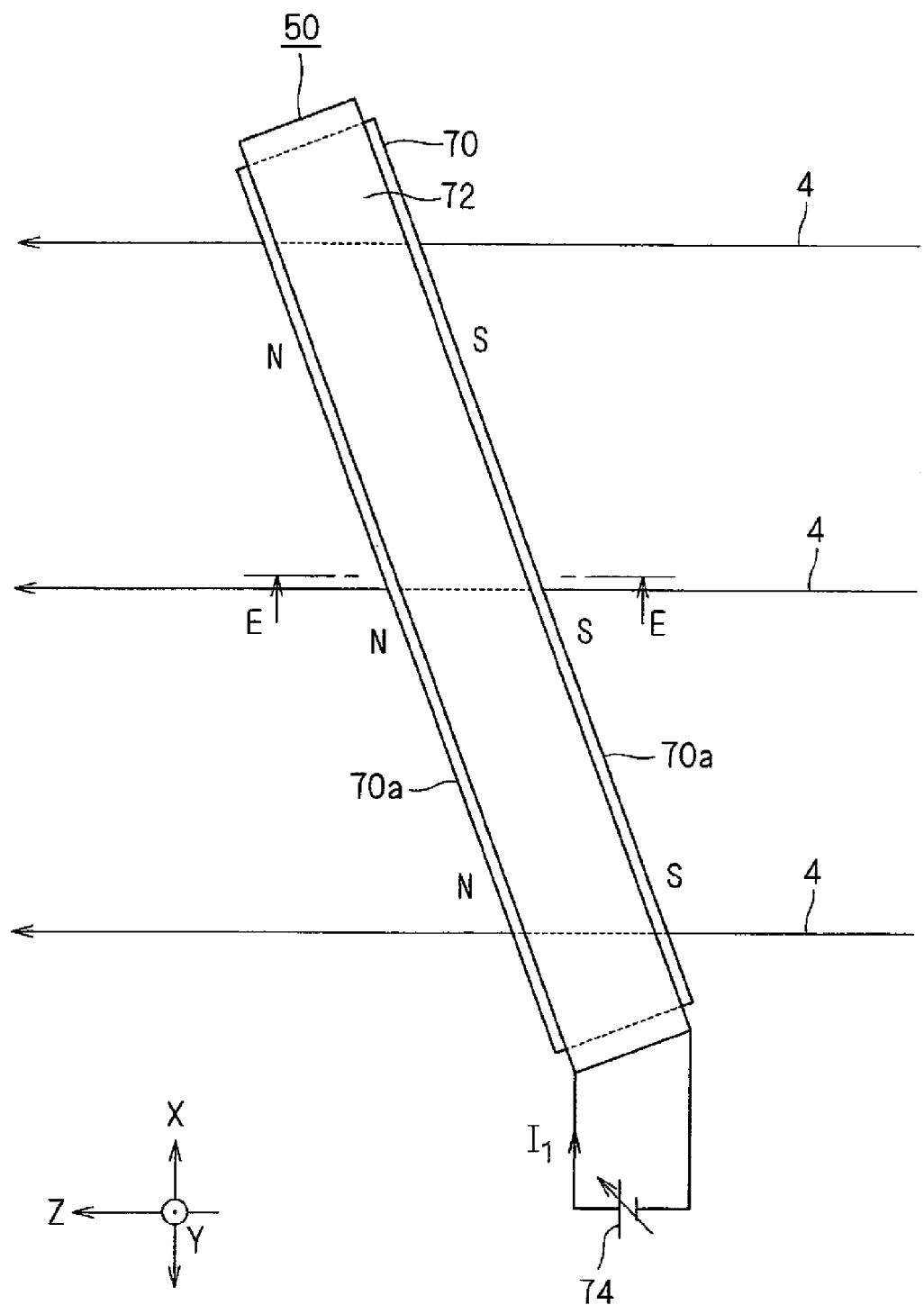
[FIG. 10] A plan view showing an example of the first magnet formed of an electromagnet, a power source therefor, and an ion beam, which corresponds to FIG. 2.
Figure 11:
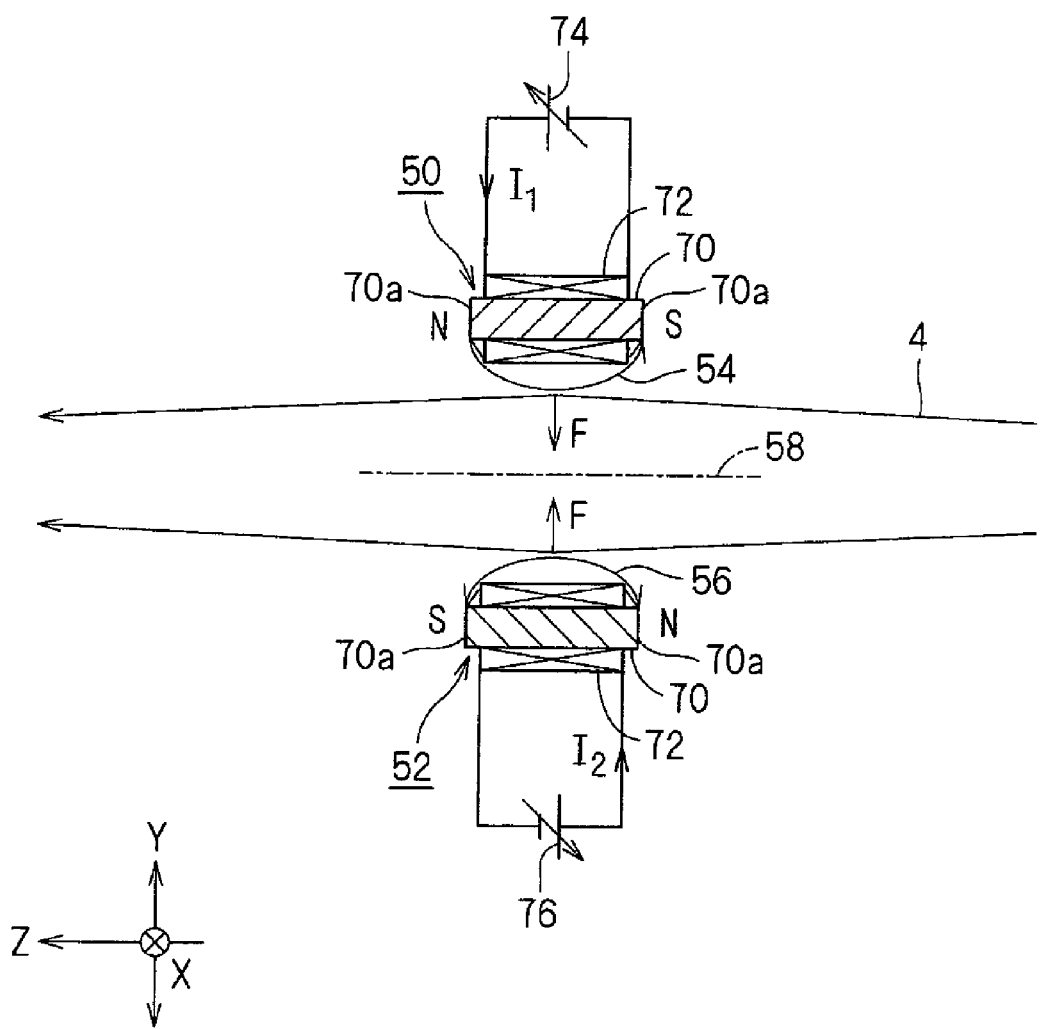
[FIG. 11] A cross-sectional view showing the first magnet, the second magnet, power sources therefore, and an ion beam generally along line E-E of FIG. 10.

An embodiment in which the straight first and second magnets 50 and 52 are formed of an electromagnet is shown in FIGS. 10 and 11. This corresponds to the embodiment shown in FIGS. 2 and 3.

Both the magnets 50 and 52 respectively have iron cores 70 having the shapes/arrangement corresponding to those of the magnets 50 and 52 shown in FIGS. 1 to 6, and coils 72 wound in the longitudinal direction of the respective iron cores 70. The two (i.e., the inlet side and the outlet side of the ion beam 4) long side 70a sides of each iron core 70 are respectively substantially magnetic poles over the overall length thereof.

Both the magnets 50 and 52 receive exciting currents $I_1$ and $I_2$ supplied from direct current sources 74 and 76, respectively, and generate magnetic fields of the same polarities as those of the embodiment shown in FIGS. 1 to 6. Therefore, by the same action as that of the embodiment shown in FIGS. 1 to 6, the ion beam may be narrowed in the Y direction.

Further, the first and second magnets 50 and 52 are electromagnets. Therefore, it is easy to adjust the intensity of the magnetic field generated thereby. Accordingly, it is possible to control the degree to which the ion beam 4 is narrowed in the Y direction with ease. For example, by changing the intensity of the magnetic field to be generated according to the energy of the ion beam 4, the ion beam 4 may be narrowed similarly at any energy. Further, by changing the intensity of the magnetic field to be generated, it is also possible to change the converging state (e.g., focal length) in the Y direction of the ion beam 4. It is also possible to control the beam dimension $d_r$, the divergence angle α, and the deflection angle θ described later. Further, it is also possible to generate a more intense magnetic field than with the permanent magnet, and to more strongly narrow the ion beam 4. The same also applies to the embodiment shown in FIG. 12.

The exciting currents $I_1$ and $I_2$ may have mutually the same magnitude or may have different magnitudes. When these have the same magnitude, one direct current electric source may be shared by both the magnets 50 and 52. Alternatively, the following configuration may be adopted. One of, or both of the direct current power sources 74 and 76 are set to be bipolar power sources, so that the orientations of the exciting currents $I_1$ and $I_2$ may be reversed. The same also applies to the embodiment shown in FIG. 12.

Figure 12:
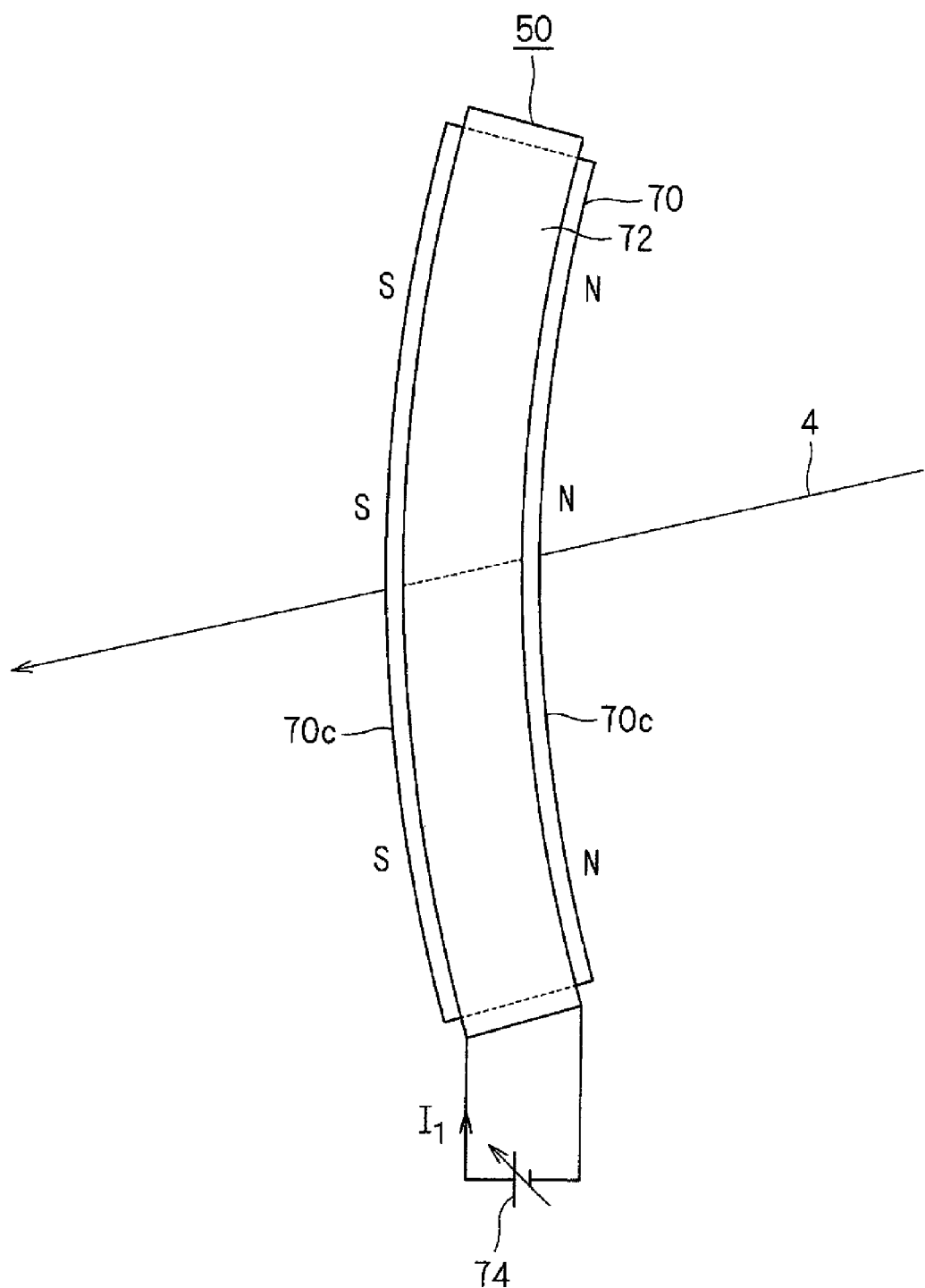
[FIG. 12] A view showing an example in which the first magnet shown in FIG. 8 is formed of an electromagnet in place of a permanent magnet.
Figure 13:
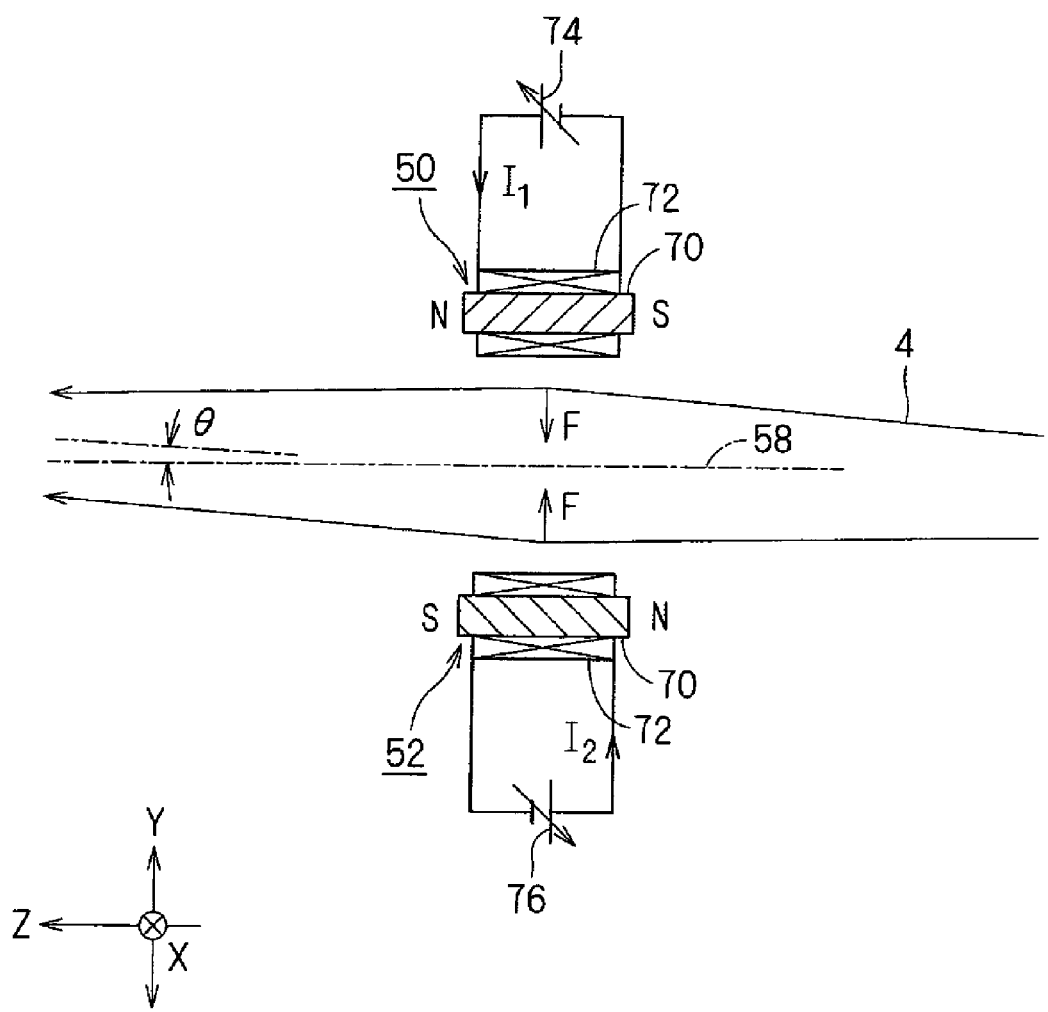
[FIG. 13] A view for illustrating an example in which the deflection angle of the ion beam is controlled by the use of the first and second magnets formed of electromagnets.

An embodiment in which the arc-like magnets 50 and 52 are each formed of an electromagnet is typified by the first magnet 50, which is shown in FIG. 12. The cross section is the same as with FIG. 11, and hence reference should be made thereto. This corresponds to the embodiment shown in FIGS. 8 and 9.

Both the magnets 50 and 52 respectively have iron cores 70 having the shapes/arrangement corresponding to those of the magnets 50 and 52 shown in FIGS. 8 and 9, and coils 72 wound in the longitudinal direction of the respective iron cores. The two (i.e., the inlet side and the outlet side of the ion beam 4) arc-like side 70c sides of each iron core 70 are respectively substantially magnetic poles over the overall length thereof. The coils 72 each may be wound straight in the longitudinal direction of the iron cores 70. However, as with the example shown, each coil 72 is preferably wound in an arc along the arc-like side 70c. With such a configuration, it is possible to generate uniform magnetic fields over both the arc-like sides 70c, i.e., substantially the overall lengths of both the magnetic poles.

Both the magnets 50 and 52 receive exciting currents $I_1$ and $I_2$ supplied from direct current sources 74 and 76, respectively, and generate magnetic fields of the same polarities as those of the embodiment shown in FIGS. 8 and 9. Therefore, by the same action as that of the embodiment shown in FIGS. 8 and 9, the ion beam may be narrowed in the Y direction.

Below, a description will be given to the case where, when the first and second magnets 50 and 52 are electromagnets, the beam dimension $d_t$ in the Y direction of the ion beam 4, the divergence angle $\alpha$, and the deflection angle $\theta$ are controlled by using them.

By reference to FIG. 1, on the upstream side of and on the downstream side of the target 24, a fore-stage multipoint Faraday 42 and a post-stage multipoint Faraday, each including a plurality of detectors for measuring the beam current of the ion beam 4 arranged in parallel in the X direction are provided, respectively. As with the technique described in, for example, JP-A-2005-195417, both the multipoint Faradays 42 and 44, and a shutter to be driven in the Y direction in front thereof are used in combination. Thus, based on the beam dimensions $d_f$ and $d_b$ in the Y direction of the ion beam 4 at two sites in the traveling direction Z of the ion beam 4, the distance $L_3$ between both the sites, and the distances $L_4$ and $L_5$ between both the sites and the target 24, the beam dimension $d_t$ in the Y direction of the ion beam 4 at the site of the target 24, and the divergence angle $\alpha$ in the Y direction of the ion beam 4 may be measured according to the following equations. Alternatively, the following configuration or the like is also acceptable. In place of disposing the shutter in front of the fore-stage multipoint Faraday 42, the fore-stage Faraday 42 is disposed, for example, in the vicinity of the downstream side of the mask 20. Thus, the fore-stage multipoint Faraday 42 is driven in the Y direction.

$$d_t = (L_5/L_3)d_f + (L_4/L_3)d_b, \text{ (where } L_3 = L_4 + L_5)$$ [Mathematical Expression 1]

$$\alpha = \tan^{-1}\{(d_b - d_f)/2L_3\}$$ [Mathematical Expression 2]

Then, the direct current power sources 74 and 76, and further the exciting currents $I_1$ and $I_2$ may be feed-back controlled based on the measured data of the beam dimension $d_t$ and the divergence angle $\alpha$ by means of a control unit not shown. For example, when the beam dimension $d_t$ in the Y direction of the ion beam 4 or the divergence angle $\alpha$ thereof is large, it is essential only that control is accordingly carried out so as to increase the absolute values (magnitudes) of the exciting currents $I_1$ and $I_2$. As a result, the ion beam 4 is more strongly narrowed in the Y direction by both the magnets 50 and 52. Therefore, the beam dimension $d_t$ and the divergence angle $\alpha$ may be decreased. The following is also possible. The divergence angle $\alpha$ at the site of the target 24 is made substantially 0. Thus, the ion beam 4 having high parallelism in the Y direction is made incident upon the target 24 for carrying out ion implantation.

To both the magnets 50 and 52, the exciting currents $I_1$ and $I_2$ having the mutually same magnitude are supplied. Thus, both the magnets 50 and 52 generate magnetic fields with the mutually same intensity. In this case, when the incident ion beam 4 is tilted in the Y direction due to some cause as with, for example, the example shown in FIG. 13, the outgoing ion beam 4 also has a deflection angle $\theta$ in the Y direction. The deflection angle $\theta$ is an angle formed between the central orbit of the ion beam 4 and the symmetric surface 58 within the YZ plane.

This may be corrected in the following manner. The exciting currents $I_1$ and $I_2$ having mutually different magnitudes are supplied to both the magnets 50 and 52, respectively. Thus, magnetic fields having mutually different intensities are generated by both the magnets 50 and 52. For example, when the incident ion beam 4 is tilted upward in the Y direction as with the example shown in FIG. 13, it is essential only that at least on of the following are carried out: the exciting current $I_1$ to be supplied to the magnet 50 on the side on which the ion beam 4 is tilted is increased; and the exciting current $I_2$ to be supplied to the magnet 52 on the opposite side is decreased. As a result, the magnetic field generated by the magnet 50 on the side on which the ion beam 4 is tilted becomes more intense. Accordingly, the downward Lorentz force F becomes larger, which may reduce the deviation angle $\theta$. The deviation angle $\theta$ may be substantially set to be 0 degree. When the deviation angle $\theta$ is reverse from the foregoing, it is essential only that the foregoing is reversed.

By the use of the fore-stage multipoint Faraday 42, the post-stage multi-point Faraday 44, and the like, as with, for example, the technique described in JP-A-2005-195417, the deviation angle $\theta$ may be measured based on the central positions $y_f$ and $y_b$ in the Y direction of the ion beam 4 at two sites in the traveling direction of the ion beam 4, and the distance $L_3$ between both the sites according to the following equation.

$$\theta = \tan^{-1}\{(y_b - y_f)/L_3\}$$ [Mathematical Expression 3]

Then, based on the measured data of the deviation angle $\theta$, the direct current power sources 74 and 76, and further the exciting currents $I_1$ and $I_2$ may be feed-back controlled by a control unit not shown so that the deviation angle becomes small (e.g., substantially 0 degree).

While description has been made in connection with exemplary embodiments of the present invention, it will be obvious to those skilled in the art that various changes and modification may be made therein without departing from the present invention. It is aimed, therefore, to cover in the appended claims all such changes and modifications falling within the true spirit and scope of the present invention.

What is claimed is:

1. An ion implantation apparatus, in which an ion beam formed in a ribbon-shape having a larger dimension in an X direction than a dimension in a Y direction substantially orthogonal to the X direction is irradiated onto a target, the ion implantation apparatus comprising:

first and second magnets provided on an upstream side of the target, facing each other in the Y direction across a center of a cross-section of a path for the ribbon-shaped ion beam, and crossing a traveling direction of the ribbon-shaped ion beam, wherein the first magnet has a first magnetic pole having a first polarity on an inlet side of the ion beam and a second magnetic pole having a second polarity opposite to the first polarity on an outlet side of the ion beam, the second magnet has a third magnetic pole having the second polarity on the inlet side of the ion beam and a fourth magnetic pole having the first polarity on the outlet side of the ion beam, and the first and second magnets generate magnetic fields in a direction so that an inward Lorentz force is applied to the ion beam between both the magnets, and the ion beam is narrowed in the Y direction.

2. The ion implantation apparatus according to claim 1, wherein the ribbon-shaped ion beam is formed by scanning the ion beam in the X direction or by not scanning in the X direction.

3. The ion implantation apparatus according to claim 1, wherein the first and second magnets are arranged substantially plane symmetrically with respect to a symmetric plane passing through a center in the Y direction of the path for the ion beam and substantially orthogonal to the X direction and the Y direction, except that the first magnet and the second magnet are opposite in polarity from each other.

4. The ion implantation apparatus according to claim 1, wherein the first and second magnets are arranged so as to obliquely cross the traveling direction of the ion beam.

5. The ion implantation apparatus according to claim 2, wherein the first and second magnets are provided on a path for the ion beam where the ion beam is scanned in a fan shape in the X direction, the first and second magnets respectively have arc shapes protruding in the traveling direction the ion beam, such that an angle formed between the advancing direction of the ion beam at each scanning position in the X direction and a straight line connecting between the pair of the magnetic poles of each magnet at the shortest distance is invariably substantially constant.

6. The ion implantation apparatus according to claim 1, further comprising:

an ion beam deflector configured to deflect the ion beam which is in an energy state so as to be irradiated onto the target by a magnetic field or an electric field, and separate the ion beam and neutral particles, wherein the first and second magnets are disposed in at least a vicinity on a downstream side of the ion beam deflector.

7. The ion implantation apparatus according to claim 1, further comprising:

an ion beam deflector configured to deflect the ion beam which is in an energy state so as to be irradiated onto the target by a magnetic field or an electric field, and separate the ion beam and neutral particles, wherein the first and second magnets are disposed in at least a vicinity on an upstream side of the ion beam deflector.

8. The ion implantation apparatus according to claim 1, wherein the first and second magnets are permanent magnets.

9. The ion implantation apparatus according to claim 1, wherein the first and second magnets are electromagnets.

10. The ion implantation apparatus according to claim 1, wherein the first magnet includes a first long side at the inlet side of the ion beam and a second long side at the outlet side of the ion beam, the first long side has the first magnetic pole over an overall length thereof, and the second long side has the second magnetic pole over an overall length thereof, and wherein the second magnet includes a third long side at the inlet side and a fourth long side at the outlet side, the third long side has the second magnetic pole over an overall length thereof, and the fourth long side has the first magnetic pole over an overall length thereof.

* * * * *